(12) United States Patent
Chidambaram et al.

(10) Patent No.: US 7,118,977 B2
(45) Date of Patent: Oct. 10, 2006

(54) SYSTEM AND METHOD FOR IMPROVED DOPANT PROFILES IN CMOS TRANSISTORS

(75) Inventors: PR Chidambaram, Richardson, TX (US); Srinivasan Chakravarthi, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/987,674

(22) Filed: Nov. 11, 2004

(65) Prior Publication Data

US 2006/0099744 A1 May 11, 2006

(51) Int. Cl.
*H01L 21/336* (2006.01)

(52) U.S. Cl. ............... 438/300; 438/304; 257/E21.431; 257/E21.634; 257/E21.619

(58) Field of Classification Search ............... 438/142, 438/197, 222, 226, 230, 233, 256, 299–304, 438/311, 429, 430; 257/E21.619, E21.634, 257/E21.431, E21.428

See application file for complete search history.

(56) References Cited

U.S. PATENT DOCUMENTS

| 6,096,642 | A  | * | 8/2000  | Wu .......................... | 438/655 |
| 6,177,336 | B1 | * | 1/2001  | Lin et al. .................. | 438/592 |
| 6,214,679 | B1 | * | 4/2001  | Murthy et al. ............. | 438/299 |
| 6,887,762 | B1 | * | 5/2005  | Murthy et al. ............. | 438/300 |
| 2004/0248369 | A1 | * | 12/2004 | Wang et al. ................ | 438/305 |

* cited by examiner

*Primary Examiner*—Brook Kebede
(74) *Attorney, Agent, or Firm*—Peter K. McLarty; W. James Brady, III; Frederick J. Telecky, Jr.

(57) ABSTRACT

According to one embodiment of the present invention, a method of forming a semiconductor device includes forming a gate stack on an outer surface of a semiconductor body. First and second sidewall bodies are formed on opposing sides of the gate stack. A first recess is formed in an outer surface of the gate stack, and a first dopant is implanted into the gate stack after the first recess is formed. The first dopant diffuses inwardly from the outer surface of the gate stack that defines the first recess. The first dopant diffuses toward an interface between the gate stack and the semiconductor body. The first recess increases the concentration of the first dopant at the interface.

10 Claims, 3 Drawing Sheets

(12)... US 7,118,977 B2

SYSTEM AND METHOD FOR IMPROVED DOPANT PROFILES IN CMOS TRANSISTORS

FIELD OF INVENTION

The present invention relates generally to semiconductor devices and more particularly to a system and method for improved dopant profiles in CMOS transistors.

BACKGROUND OF THE INVENTION

During the fabrication of certain types of semiconductor devices, a gate stack may be formed on the surface of a semiconductor body. The area of the semiconductor body that lies below the gate stack defines a selectively conductive channel region. Various conductive regions in the semiconductor device may be formed by the implantation of one or more dopants into the layers of the semiconductor device. For example, a dopant may be implanted within the semiconductor body on either side of the gate stack to form source and drain regions. Additionally, a dopant may be implanted into and diffused through the gate stack to improve the conductivity of the gate stack. Specifically, the dopant migrates through the gate stack in a substantially vertical direction toward an interface within the gate stack. As semiconductor manufacturers continue to reduce the scale of semiconductor devices, however, the diffusion of dopants through the gate stack becomes more difficult. Where the concentration of dopant at the desired interface is too low, the reliability of the gate stack as a conductor may be reduced and the ability of the gate stack to control the conductivity of the channel can be impeded.

SUMMARY OF THE INVENTION

In accordance with the present invention, a system and method for forming semiconductor devices on the surface of the wafer is provided that substantially eliminates or greatly reduces disadvantages and problems associated with conventional semiconductor fabrication equipment.

According to one embodiment of the present invention, a method of forming a semiconductor device includes forming a gate stack on an outer surface of a semiconductor body. First and second sidewall bodies are formed on opposing sides of the gate stack. A first recess is formed in an outer surface of the gate stack, and a first dopant is implanted into the gate stack after the first recess is formed. The first dopant diffuses inwardly from the outer surface of the gate stack that defines the first recess. The first dopant diffuses toward an interface between the gate stack and the semiconductor body. The first recess increases the concentration of the first dopant at the interface.

Certain examples of the invention may provide one or more technical advantages. A technical advantage of one exemplary embodiment of the present invention is that the diffusion of dopant through a gate stack may be improved. In particular, the concentration of dopant at the interface of a gate conductor layer and a gate insulator layer may be increased. Another technical advantage may be that the drive current and/or substrate capacitance associated with the semiconductor device may be improved. As a result, the semiconductor device may be more reliable and operate in a more efficient manner.

Other technical advantages may be readily apparent to one skilled in the art from the figures, descriptions and claims included herein. None, some, or all of the examples may provide technical advantages.

BRIEF DESCRIPTION OF THE DRAWINGS

For a more complete understanding of the present invention and its features and advantages, reference is now made to the following description, taken in conjunction with the accompanying drawings, in which like reference numerals refer to like elements, and wherein.

DETAILED DESCRIPTION OF THE INVENTION

In order to form an integrated circuit device such as a field effect transistor, various conductive and nonconductive layers are typically deposited or grown on a semiconductor body or other outer semiconductor layer. FIGS. 1A–1H are cross-sectional views of a semiconductor structure 10 during the formation of multiple layers on an outer surface of a semiconductor body 14. Semiconductor structure 10 may be used as a basis for forming any of a variety of semiconductor devices, such as a bipolar junction transistor, an NMOS transistor, a PMOS transistor, a CMOS transistor, a diode, a capacitor, or other semiconductor based device. Particular examples and dimensions specified through out this document are intended for exemplary purposes only, and are not intended to limit the scope of the present disclosure. Moreover, the illustration in FIGS. 1A–1G are not intended to be to scale. As will be discussed in more detail below, conventional semiconductor fabrication techniques for forming semiconductor based devices typically include the doping of various layers of the semiconductor structure to form one or more active regions. Where the dopant is prevented from diffusing through the various layers of the semiconductor device, the semiconductor structure may exhibit increased junction capacitance, diode leakage, and/or increased source, gate, and drainage capacitance. According to various embodiments, however, such defects may be greatly reduced or substantially limited.

Figure 1A:
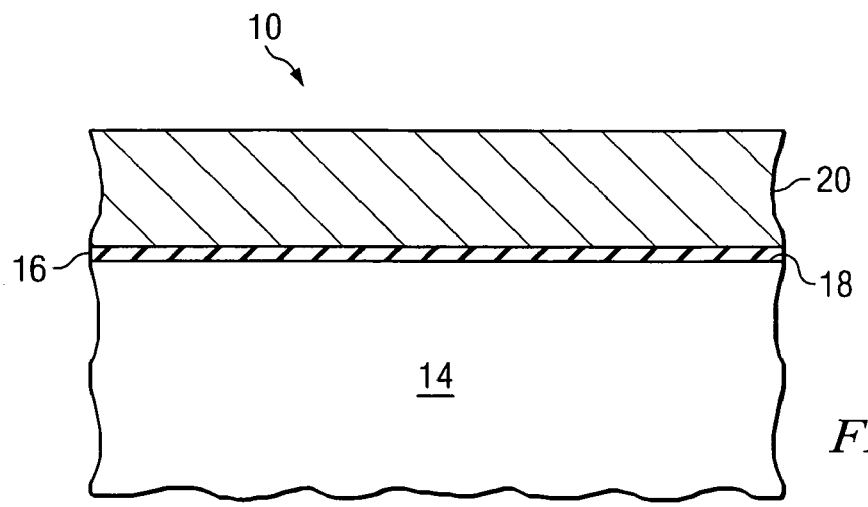
FIGS. 1A–1H are cross-sectional diagrams showing the formation of multiple layers on an outer surface of a semiconductor body in accordance with one embodiment of the present invention.

FIG. 1A is a cross-sectional view of semiconductor structure 10 after the formation of multiple layers on a semiconductor body 14. Semiconductor body 14 may comprise any suitable material used in the fabrication of semiconductor structures. For example, in particular embodiments, semiconductor body may include silicon, germanium, gallium arsenide, or other suitable semiconductive material.

In the illustrated embodiment, a gate dielectric layer 16 is formed outwardly from an outer surface 18 of semiconductor body 14. Gate dielectric layer 16 may comprise layers of silicon dioxide, silicon nitride, or combinations thereof. In other embodiments, gate dielectric layer 16 may comprise other types of gate dielectrics (such as high-k dielectrics). Gate dielectric layer 16 may be formed on outer surface 18 of semiconductor body 14 using any of a variety of processes. For example, gate dielectric layer 16 may be formed by growing an oxide or nitrided oxide layer. In particular embodiments, gate dielectric layer 16 may be of a thickness on the order of approximately 1 to 3 nanometers (nm), and in some example embodiments may be of a thickness of approximately 1.2 nm. Following the oxidation process and where desired, nitrogen can be incorporated into gate dielectric layer 16 through plasma or thermal nitridation. Although gate dielectric layer 16 and semiconductor body 14 are shown as being formed without interfacial layers between them, such interfacial layers could alternatively be formed without departing from the scope of the present disclosure.

Following the formation of gate dielectric layer 16, a conductive gate layer 20 may then be formed on the surface of gate dielectric layer 16. Conductive gate layer 20 may include a layer of amorphous silicon or alloy, polycrystalline silicon or alloy, or other appropriate conductive material used in the fabrication of semiconductor structures. Conductive gate layer 20 may be formed by any of a variety of techniques including chemical vapor deposition (CVD) and physical vapor deposition (PVD). For example, conductive gate layer 20 may be formed by depositing a desired amount of polycrystalline silicon over gate dielectric layer 16. In particular embodiments, it may be desirable for conductive gate layer 20 to be of a thickness on the order of 90 to 160 nm. For example, conductive gate layer 20 may be deposited to a thickness of approximately 120 nm. Although gate dielectric layer 16 and conductive gate layer 20 are shown as being formed without interfacial layers between them, such interstitial layers could be formed without departing from the scope of the present disclosure.

Figure 1B:
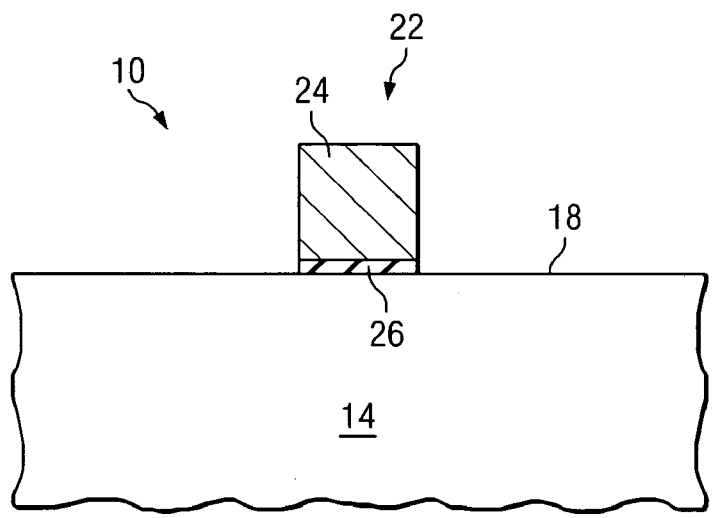

FIG. 1B is a cross-sectional view of semiconductor structure 10 after the formation of a gate stack 22 on the surface of semiconductor body 14. Gate stack 22 may be formed from conductive gate layer 20 and gate dielectric layer 16. Thus, gate stack 22 may include a gate conductor 24 and a gate insulator 26. The formation of semiconductor gate stack 22 may be effected through any of a variety of processes. For example, semiconductor gate stack 22 may be formed by patterning gate conductor layer 20 and gate insulator layer 16 using suitable photolithographic methods including photo resist mask and etch techniques. In particular embodiments, gate stack 22 may have a width on the order of 25 nm to 10 .mu.m and have a height on the order of about 90 .mu.m to about 170 nm. It is recognized, however, that gate stack 22 may be of any appropriate dimensions suitable for the fabrication of semiconductor structures.

Figure 1C:
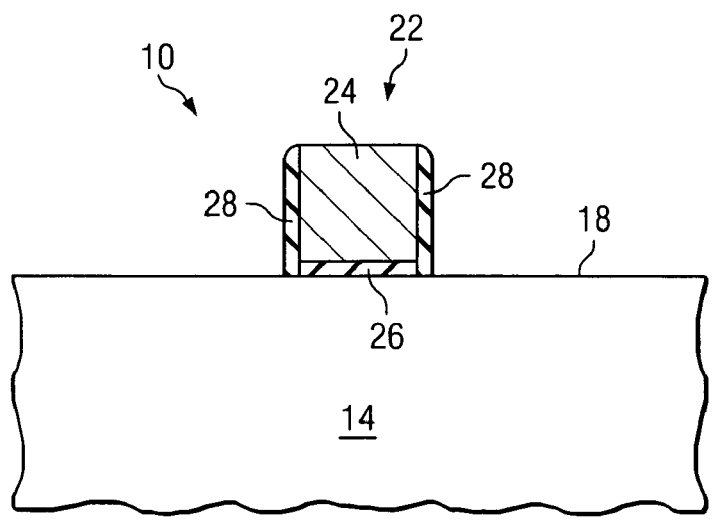

In FIG. 1C, the semiconductor structure 10 is illustrated after the formation of offset spacers 28 on the opposing sides of gate stack 22. Offset spacers 28 may include nitride, silicon nitride, oxide, oxi-nitride, silicon dioxide, or a combination of any of these materials or other appropriate materials used in semiconductor fabrication. Offset spacers 28 may be formed by any of a variety of semiconductor processes. For example, offset spacers 28 may be formed by thermally growing or depositing an oxide layer. In particular embodiments, offset spacers 28 comprise silicon dioxide of a thickness on the order of 1 to 12 nm and, in some example embodiments, of a thickness of approximately 5 nm. Although offset spacers 28 are shown as including a single layer, it is recognized that offset spacers 28 may include any suitable number of layers of the above described materials. For example, in particular embodiments offset spacers 28 may include at least two layers that are selectively etchable with respect to each other.

Figure 1D:
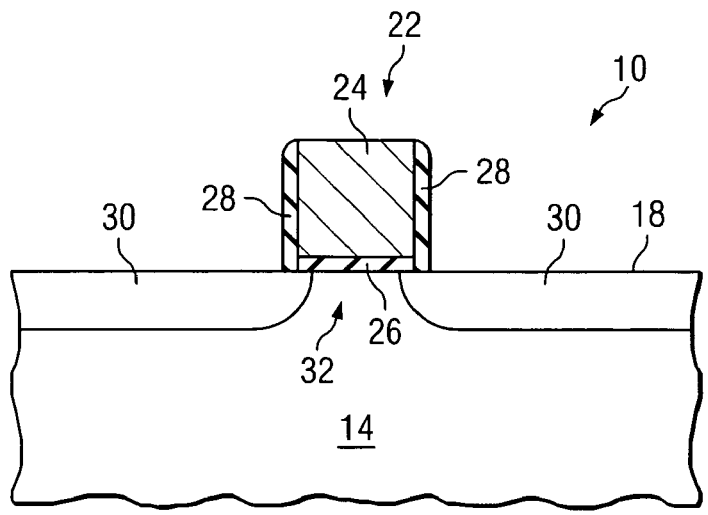

At some point, the conductive regions of semiconductor structure 10 may be formed by doping such regions to render them conductive. Conductive regions may include, for example, source drain regions or source drain extension regions. FIG. 1D shows semiconductor structure 10 after the formation of source drain extension regions 30 on opposing sides of gate stack 22. In particular embodiments associated with PMOS devices, source drain extension regions 30 may include p-type source drain regions. In such embodiments, a p-type dopant, such as Boron, may be used to form source drain extension regions 30. In other embodiments associated with NMOS devices, source drain extension regions 30 may include n-type source drain regions, and an n-type dopant, such as phosphorous and/or arsenic, may be used to form source drain extension regions 30. By one common measure, the depth of source drain extension regions 30 is measured as a function of a junction depth. The junction depth corresponds to the point within semiconductor body 14 at which the concentration of dopant is approximately 1 to $3e^{17}$ ions/cm.sup.3. For example, in particular embodiments, the junction depth of source drain extension regions 30 may be on the order of 15 to 45 nm and, in some embodiments, may be approximately 30 nm.

source drain extension regions 30 may be formed by low or high-energy ion implantation, low or high-energy diffusion, or by any other appropriate technique for doping semiconductor body 14. The energy used to dope semiconductor body 14 to form source drain extension regions 30 may depend on whether source drain extension regions 30 comprise NMOS active areas or PMOS active areas. For example, where source drain extension regions 30 are NMOS active areas, the formation of source drain extension regions 30 may be by one or more high-energy or high-dose ion implantations or diffusions. In a particular embodiment, NMOS source drain extension regions 30 may be formed by a high does implantation of an n-type arsenic dopant at a dose on the order of approximately $2e^{15}$ ions/cm$^2$ and an implantation energy on the order of about 15 to about 30 keV. The high-dose implantation may be followed by, or replaced by, a high dose implantation of phosphorous dopant at a dose on the order of approximately $2e^{15}$ ions/cm$^2$ and an implantation energy on the order of about 20 to about 45 keV. The described implantation parameters for forming source drain extension regions 30, however, are merely one example implantation process for forming NMOS source drain extension regions 30. It is recognized that any appropriate n-type dopant may be used at any high-energy or high dose concentration for the formation of NMOS type source drain extension regions 30.

Conversely, in PMOS devices where source drain extension regions 30 comprise p-type conductive areas, the formation of source drain extension regions 30 may be by a high dose implantation of a p-type dopant followed by a high energy implantation of a p-type dopant. For example, in particular embodiments, the formation of PMOS source drain extension regions 30 may be by a high does implantation of an p-type boron dopant at a dose on the order of approximately $1e^{15}$ to $5e^{15}$ ions/cm$^2$ and an implantation energy on the order of about 1 to about 4 keV. The high-dose implantation may be followed by a high energy implantation of p-type boron dopant at a dose on the order of approximately $1e^{13}$ to $1e^{14}$ ions/cm$^2$ and an implantation energy on the order of about 3 to about 11 keV. The described implantation parameters for forming source drain extension regions 30, however, are merely one example implantation process for forming PMOS source drain extension regions 30. It is recognized that any appropriate p-type dopant may be used at any high-energy or high dose concentration for the formation of PMOS type source drain extension regions 30.

source drain extension regions 30 are typically formed after the formation of offset spacers 28. Forming source drain extension regions 30 after the formation of offset spacers 28 may be advantageous in minimizing damage to semiconductor body 14 that results from the formation of source drain extension regions 30 by substantially preventing implant channeling in semiconductor body 14. Forming source drain extension regions 30 after the formation of offset spacers 28 results in the self-alignment of implanted dopants with respect to the outer edge of offset spacers 28. Thus, source drain extension regions 30 initiate from points within semiconductor body 14 that correspond approximately with the outward edges of offset spacers 28. source drain extension regions 30 are separated by channel region 32 also defined in semiconductor body 14. At some point after formation, source drain extension regions 30 may be activated by annealing semiconductor structure 10. The anneal step may be achieved using various processes such as a rapid thermal anneal (RTA) process. Annealing and other high temperature processes may result in the lateral migration of each source drain extension region 30 toward the opposing source drain extension region 30. Thus, source drain extension regions 30 may migrate toward one another beneath gate stack 22, as is shown in FIG. 1D. As a result, at some point during the semiconductor fabrication process, source drain extension regions 30 may not be aligned with the outward edges of offset spacers 28 and the distance of channel 32 may be decreased such that the channel corresponds to the gate.

Figure 1E:
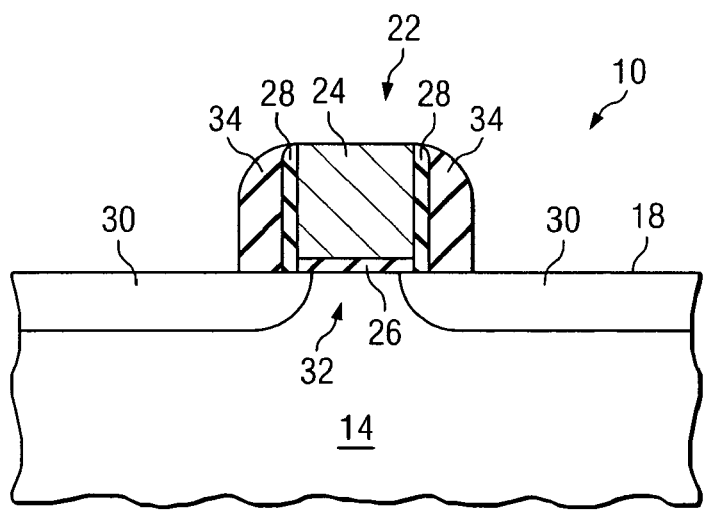

FIG. 1E is a cross-sectional view of semiconductor structure 10 after the formation of sidewall bodies 34 on opposing sides of gate stack 22. Sidewall bodies 34 comprise an insulating material that may include oxide, oxi-nitride, silicon dioxide, nitride, or a combination of any of these materials or other appropriate materials used in semiconductor fabrication. Sidewall bodies 34 may be formed by any of a variety of semiconductor processes. Typically, the material forming sidewall bodies 34 is deposited in a generally conformal manner over semiconductor structure 10 and subsequently subjected to an anisotropic etch to remove the insulating material on top of the gate stack 22 and over the active areas at least partially forming source drain extension regions 30. In other embodiments, sidewall bodies 34 may be formed by thermally growing an oxide. For example, in a particular embodiment, sidewall bodies 34 may include a silicon dioxide grown to a thickness on the order of 25 to 110 nm. In a particular embodiment, a silicon dioxide sidewall body 34 may be of a thickness on the order of approximately 70 nm.

Although sidewall bodies 34 are shown as including a single layer, it is recognized that sidewall bodies 34 may include any suitable number of layers of any combination of the above described materials.

Figure 1F:
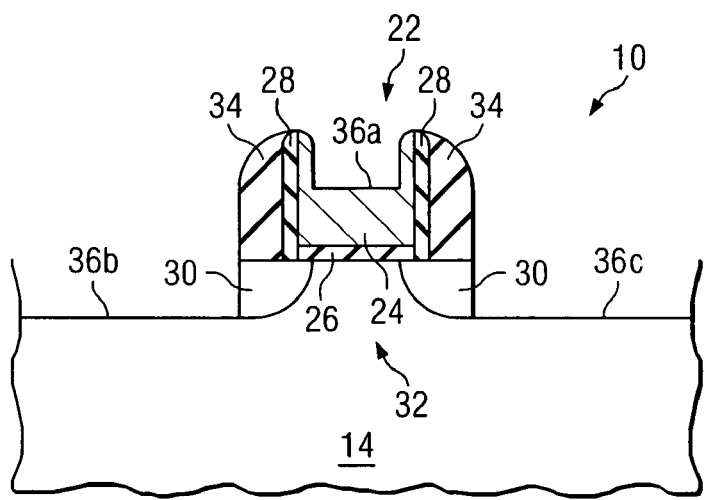

FIG. 1F is a cross-sectional view of semiconductor structure 10 after the formation of recesses 36 in various layers of semiconductor structure 10. Specifically, a first recess 36a may be formed in the outer surface of gate stack 22. A second and a third recess 36b and 36c may additionally be formed on opposing sides of gate stack 22 in at least a portion of the region that comprised source drain extension regions 30. Recesses 36 may be formed using an etch process that may include a dry etch, a plasma etch, a plasma assisted etch, or a wet etch. The etch may be selectable to the materials comprising source drain extension regions 30 and gate conductor 24, such that portions of source drain extension regions 30 and gate conductor 24 are removed by the etch process. In particular embodiments, recess 36a may be formed to a depth on the order of approximately 10 to 100 nm, and in some example embodiments to a depth of approximately 30 nm. Recesses 36b and 36c may be formed to a depth on the order of approximately 20 to 70 nm, and in some example embodiments to a depth of approximately 30 nm.

Figure 1G:
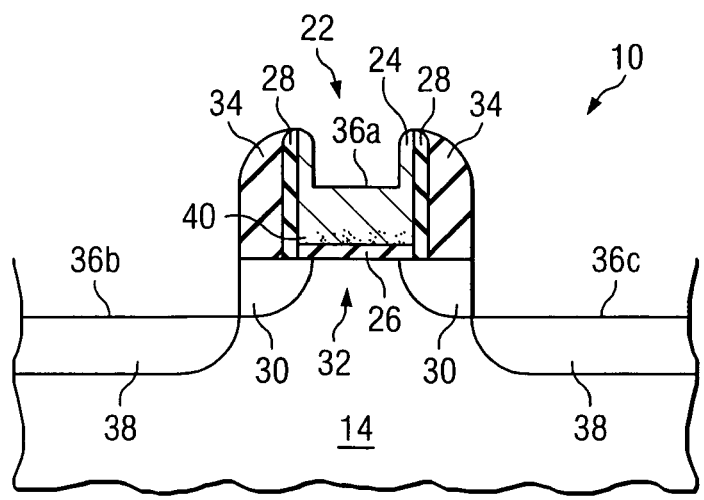
Figure 1H:
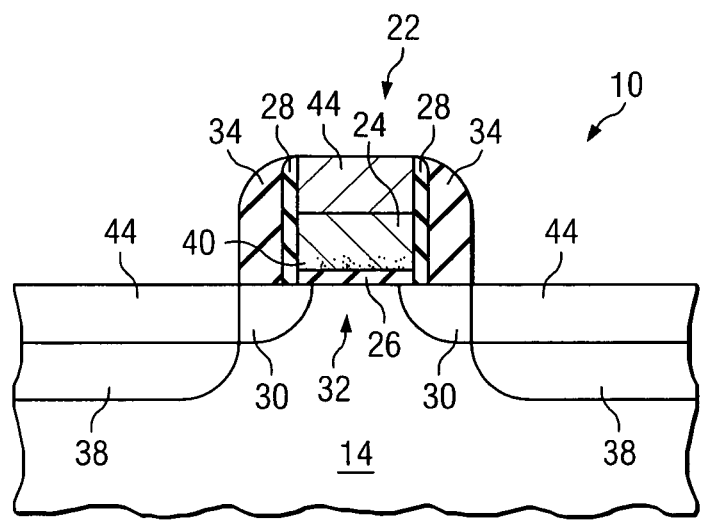

Following the formation of recesses 36, semiconductor structure 10 may be doped to form one or more conductive regions. FIG. 1G is a cross-sectional view of semiconductor structure 10 after the formation of source drain regions 38. In particular embodiments, source drain regions 38 may include p-type source drain extension regions formed in a PMOS region. Accordingly, a p-type dopant, such as boron, may be used to form source drain regions 38. In other embodiments, source drain regions 38 may include n-type source drain extension regions formed in an NMOS region, and an n-type dopant, such as phosphorous and/or arsenic, may be used to form source drain regions 38. Similar to source drain extension regions 30, the depth of source drain regions 38 may be measured as a function of junction depth. The junction depth of source drain regions 38 may correspond to the point within semiconductor body 14 at which the concentration of dopant is approximately 1 to $5e^{17}$ ions/cm.sup.3. For example, in particular embodiments, the junction depth of source drain regions 38 may be on the order of 80 to 170 nm, and in some embodiments, may be approximately 100 nm.

source drain regions 38 may be formed by low or high-energy ion implantation, low or high-energy diffusion, or by any other appropriate technique for doping semiconductor body 14. The level of energy used to dope semiconductor body 14 to form source drain regions 38 may depend on whether source drain regions 38 comprise NMOS active areas or PMOS active areas. For example, where source drain regions 38 are NMOS active areas, the formation of source drain regions 38 may be by one or more high-energy ion implantations or diffusions. Thus, in a particular embodiment, NMOS source drain regions 38 may be formed by a high dose implantation of an n-type arsenic dopant at a dose on the order of approximately $2e^{15}$ ions/cm$^2$ and an implantation energy on the order of about 15 to about 30 keV. The high-dose implantation may be followed by, or replaced by, a high dose implantation of phosphorous dopant at a dose on the order of approximately $2e^{15}$ ions/cm$^2$ and an implantation energy on the order of about 20 to about 45 keV. The described implantation parameters for forming source drain regions 38, however are merely one example implantation process for forming NMOS source drain regions 38. It is recognized that any appropriate n-type dopant may be used at any high-energy or high dose concentration for the formation of NMOS type source drain regions 38.

Conversely, where source drain regions 38 comprise p-type conductive areas, the formation of source drain regions 38 may be by a high dose implantation of a p-type dopant followed by a high energy implantation of a p-type dopant. For example, in particular embodiments, the formation of PMOS source drain regions 38 may be by a high dose implantation of an p-type Boron dopant at a dose on the order of approximately 1 to $5e^{15}$ ions/cm$^2$ and an implantation energy on the order of about 1 to about 4 keV. The high-dose implantation may be followed by a high energy implantation of p-type Boron dopant at a dose on the order of approximately $1e^{13}$ to $1e^{14}$ ions/cm$^2$ and an implantation energy on the order of about 3 to about 11 keV. The described implantation parameters for forming source drain regions 38, however are merely one example implantation process for forming PMOS source drain regions 38. It is recognized that any appropriate p-type dopant may be used at any high-energy or high dose concentration for the formation of PMOS type source drain regions 38.

Forming source drain regions 38 after the formation of sidewall bodies 34 minimizes damage to semiconductor body 14 during the formation of source drain regions 38. Thus, sidewall bodies 34 protect source drain regions 38 disposed inwardly from gate stack 22 by substantially preventing implant channeling in semiconductor body 14. Forming source drain regions 38 after the formation of sidewall bodies 34 results in the self-alignment of implanted dopants with respect to the outer edge of sidewall bodies 34. Thus, source drain regions 38 initiate from points within semiconductor body 14 that correspond approximately with the outward edges of sidewall bodies 34. Like source drain extension regions 30, source drain regions 38 are separated by channel region 32 defined in semiconductor body 14. Also similar to source drain extension regions 30, source drain regions 38 may be activated at some point after formation by annealing semiconductor structure 10. Annealing and other high temperature processes may result in the lateral migration of each source drain region 38 toward the opposing source drain region 38. Thus, source drain regions 38 may migrate toward one another beneath gate stack 22. As a result, at some point during the semiconductor fabrication process, and as shown in FIG. 1G, source drain regions 38 may not be aligned with the outward edges of sidewall bodies 34 and the distance of channel 32 may be decreased The doping of semiconductor substrate 10 to form source drain regions 38 may also result in the doping of gate conductor 24 of gate stack 22, which improves the conductivity of gate stack 22. To implant dopant 40 in gate stack 22, dopants 40 are implanted on the outer surface of gate conductor 24, as defined by recess 36a. Dopant 40 diffuses in a substantially vertical direction through gate conductor 24 before reaching portions of gate conductor 24 proximate gate insulator 26. The diffusion of dopant 40 through gate conductor 24 affects the strength of an electric field that communicates across gate insulator 26. The thickness of gate conductor 24 affects the ability of dopants 40 to diffuse through gate stack 22. Where gate conductor 24 is thicker, the concentration of dopant 40 at the interface between gate conductor 24 and gate insulator 26 may be less than desired. The formation of recess 36a before the diffusion of dopant 40 to activate source drain regions 38 and gate conductor 24, however, ultimately increases the concentration of dopant 40 at the interface between gate conductor 24 and gate insulator 26. Specifically, because the overall depth of gate conductor 24 is reduced, dopant 40 must travel a shorter distance through gate conductor 24 to reach the interface. Accordingly, the uniformity of the dopant near the interface may be improved. As a result, the strength of the produced electric field may also be improved. An improved dopant depth profile for a gate stack 22 that includes a recess 36a formed before the doping of gate stack 22 is described in greater detail below with regard to FIG. 2.

Following the formation of recesses 36 and the subsequent doping steps described previously, silicon germanium layers 44 may be formed in recesses 36. In particular embodiments, silicon germanium layers 44 may be formed using a selective epitaxial deposition process such as a low pressure chemical vapor deposition process (LPCVD) using dichlorosilane and germane as the source gases. While not intending to be limited to any one embodiment, it is believed that silicon germanium layers 44 within recesses 36b and 36c form an alloy that has a lattice with the same structure as the silicon body lattice. The lattice of silicon germanium layers 44, however, has a larger spacing. Consequently, it is believed that, in particular embodiments, silicon germanium layers 44 within recesses 36b and 36c will tend to expand, thereby creating a compressive stress within channel 32 of the semiconductor body.

In some embodiments, silicon germanium layers 44 may be subjected to a p-type implant to form a p-type silicon germanium material (e.g., using boron). In other embodiments, and more preferably, silicon germanium layers 44 may be doped in-situ during the selective epitaxial deposition process by incorporating a p-type dopant reactant in the CVD process. For example, diborane or other type reactant may be employed, wherein a boron doped silicon germanium material is formed in the recesses (or other p-type dopant in silicon germanium layers 44, as may be appreciated). The in-situ boron doping of silicon germanium layers 44 is preferred because it is believed that the in-situ doped boron is activated to a higher degree than when implanted into silicon germanium layers 44, and therefore advantageously provides a lower extension region resistance.

If silicon germanium layers 44 are not doped in-situ, as discussed above, an extension region implant may be performed to introduce dopants into the silicon germanium material in recesses 36. For example, lightly doped, medium doped or heavily doped extension region implants may be performed in the source drain regions. Since recesses 36 (now filled with silicon germanium) and the extension region implants are formed after the formation of sidewall bodies 34, both are self-aligned with respect to sidewall bodies 34, thereby placing both regions proximate the lateral edge of gate stack 22 within semiconductor body 14. A thermal process such as a rapid thermal anneal may then be employed to activate the extension region dopants, which causes the extension regions to diffuse laterally slightly underneath the offset spacer 28 toward the channel 32.

Following the formation of silicon germanium layers 44, silicide processing may be used to form a metal layer (not shown) over the device. The silicide processing may be followed by a thermal process, wherein the metal and silicon interfaces react to form a silicide (on top of gate stack 22 and in source drain extension regions 30 and source drain regions 38). Unreacted metal is then stripped away, and back end processing such as interlayer dielectric and metallization layers are formed to conclude the semiconductor device formation.

Figure 2:
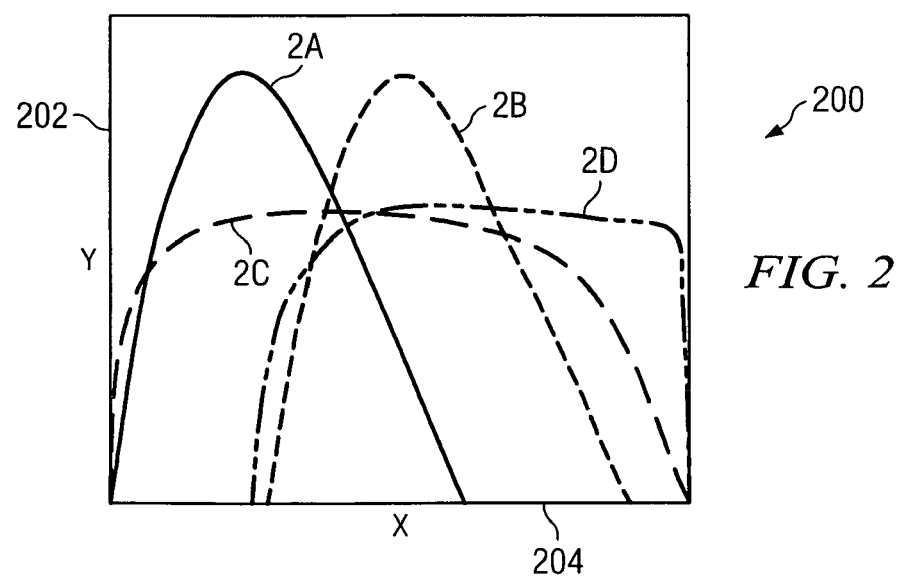
FIG. 2 is a dopant depth profile illustrating the effects of forming a recess in a gate stack prior to activation of the semiconductor body in accordance with one embodiment of the present invention.

FIG. 2 is a dopant profile 200 illustrating the effect of forming a recess 36a in gate stack 22 prior to activation of semiconductor body 14. On the schematic, the y-axis 202 represents the concentration of dopant at various depths, represented by the x-axis 204, throughout gate stack 22. Specifically, line 2A represents the dopant depth profile for a conventional gate stack that does not include a recess 36a formed before the dopant is implanted into the gate stack. Conversely, line 2B represents the dopant depth profile for gate stack 22 that includes recess 36a formed before the dopant is implanted into gate stack 22.

As illustrated in FIG. 2, the formation of recess 36a effectively shifts the dopant profile down x-axis 204. The shift indicates that a higher concentration of dopant 40 is present near the interface of gate conductor 24 and gate insulator 26. The amount of shift is identical to the depth of recess 36a, and thus the reduction of the height of gate stack 22. For example, in a gate stack formed without a recess, the highest concentration of dopant may be at a depth on the order of 30 to 70 nm, as measured from the top of the gate stack. Conversely, where gate stack 22 is formed with recess 36a having a depth on the order of 30 to 100 nm and, thus, the depth of gate stack 22 is reduced by that amount, the greatest concentration of dopant 40 may be at a depth on the order of 60 to 120 nm, as measured from the top of gate stack 22 as defined by recess 36a. The greater concentration is a result of the dopant 40 having to travel a shorter distance through gate conductor 24 to reach the interface. Thus, the concentration of dopant 40 near the interface may be improved. Additionally, the uniformity of dopant 40 near the interface may be improved, and the produced electric field may be stronger.

As discussed above, an anneal is typically performed to activate source drain regions 38 and gate conductor 24. The anneal operates to modify the properties of source drain regions 38 and gate conductor 24. For example, the anneal may operate to distribute a higher concentration of dopant near the interface of gate conductor 24 and gate insulator 26. Line 2C represents the dopant depth profile of a conventional gate stack that does not include the formation of a recess in the top surface of the gate stack after the anneal step is performed. Line 2C indicates, however, that the concentration of dopant near the interface of gate conductor 24 and gate insulator 26 remains lower than desired even after the anneal is performed. By contrast, Line 2D represents the dopant depth profile of gate stack 22 that includes the formation of recess 36a after an anneal is performed. Line 2D indicates that the concentration of dopant near the interface of the gate conductor 24 and gate insulator 26 is increased substantially. As a result, the strength and uniformity of the produced electric field over gate insulator 26 may be improved.

Although the present invention has been described in detail, it should be understood that various changes, alterations, substitutions, and modifications can be made to the teachings disclosed herein without departing from the spirit and scope of the present invention which is solely defined by the appended claims.

The invention claimed is:

1. A method of forming a semiconductor device, comprising:
   forming a gate stack on an outer surface of a semiconductor body, the gate stack including a gate conductor;
   forming a first and second sidewall bodies on opposing sides of the gate stack;
   simultaneously forming a first recess in an outer surface of the gate conductor and second and third recesses in a region of the semiconductor body; and
   simultaneously implanting a first dopant into the gate conductor and the semiconductor body through the first, second and third recesses, the first dopant diffusing inwardly from the outer surface of the gate conductor that defines the first recess, the first dopant diffusing toward an interface between the gate stack and the semiconductor body, the first recess increasing the concentration of the first dopant at the interface, and further wherein the first dopant diffuses into the semiconductor body to form a first source drain region.

2. The method claim 1, wherein forming the first recess comprises performing an etch to remove a portion of the gate conductor layer of the gate stack.

3. The method claim 1, further comprising:
   epitaxially growing silicon germanium in the first recess.

4. The method of claim 1, wherein the first recess has a depth on the order of 10 to 100 nm.

5. The method of claim 1, wherein implanting the first dopant into the semiconductor body comprises implanting an n-type implant or a p-type implant.

6. The method of claim 1, further comprising:
   forming a first and second offset spacers on the opposing sides of the gate stack before forming the first and second sidewall bodies; and
   implanting a second dopant into the semiconductor body to form a second source drain region, the second source drain region formed before the first source drain region; and
   performing a thermal process to diffuse the second dopant laterally to extend the second source drain region below the first and second offset spacers toward the gate stack.

7. The method of claim 6, wherein implanting a second dopant comprises implanting an n-type extension region implant or a p-type extension region implant.

8. The method of claim 1 wherein
   each of the second and third recesses are substantially aligned with a one of the opposing sides of the gate stack.

9. The method of claim 1, further comprising:
   axially growing silicon germanium in the second and third recesses.

10. The method of claim 1 further comprising simultaneously growing silicon germanium in the first, second and third recesses using an epitaxial process.

* * * * *